United States Patent [19]

Ikeno et al.

[11] 4,262,227
[45] Apr. 14, 1981

[54] THICKNESS-SHEAR PIEZO-ELECTRIC VIBRATOR WITH ADDITIONAL MASS FOR MODE SUPPRESSION

[75] Inventors: Hitoshi Ikeno; Tetsuro Konno; Mitsuyuki Sugita; Hirofumi Yanagi, all of Tokyo, Japan

[73] Assignee: Kabushiki Kaisha Seikosha, Tokyo, Japan

[21] Appl. No.: 959,456

[22] Filed: Nov. 13, 1978

[30] Foreign Application Priority Data

Nov. 16, 1977 [JP] Japan .................... 52-137555

[51] Int. Cl.³ ............................................. H01L 41/08
[52] U.S. Cl. ..................................... 310/312; 310/361; 310/369; 310/365
[58] Field of Search ............... 310/365, 366, 361, 312, 310/369

[56] References Cited

U.S. PATENT DOCUMENTS

| 3,097,315 | 7/1963 | Shinada et al. | 310/365 |
| 4,114,062 | 9/1978 | Mattuschka | 310/365 X |

FOREIGN PATENT DOCUMENTS 2805491  8/1978  Fed. Rep. of Germany ........... 310/365

*Primary Examiner*—Mark O. Budd
*Attorney, Agent, or Firm*—Robert E. Burns; Emmanuel J. Lobato; Bruce L. Adams

[57] ABSTRACT

A thickness-shear mode piezo-electric vibrator comprises a piezo-electric crystal operable in the thickness-shear mode, driving electrodes formed on opposed surfaces of the crystal, and an addition mass formed on at least one of the driving electrodes and positioned on the nodal line of a 3-fold harmonic vibration so that the frequency $f_o$ of the fundamental main vibration and the frequency $f_{3s}$ of the 3-fold harmonic vibration always satisfy the following relation within the practical application ranges of temperature and load capacitance;

$$f_o \neq \frac{f_{3s}}{3}$$

thereby effectively eliminating or preventing the "abnormal frequency phenomenon" which would otherwise occur due to the 3-fold harmonic vibrations.

8 Claims, 14 Drawing Figures

THICKNESS-SHEAR PIEZO-ELECTRIC VIBRATOR WITH ADDITIONAL MASS FOR MODE SUPPRESSION

BACKGROUND OF THE INVENTION

The present invention relates generally to a piezo-electric vibrator and, more precisely, a piezo-electric vibrator whose fundamental vibration mode is the thickness-shear mode, like an AT-cut quartz vibrator, a BT-cut quartz vibrator or a ceramic vibrator.

It has experimentally been confirmed by the inventors of this invention that in piezo-electric vibrators of the thickness-shear vibrational mode, there is an "abnormal frequency phenomenon" which is different from the well-known "jump phenomenon", the latter phenomenon being one in which the fundamental main vibration is drawn into a spurious vibration whose mode is different from that of the fundamental main vibration. The "abnormal frequency phenomenon", on the other hand is a phenomenon which is induced by harmonic vibrations whose mode is the same one as the fundamental main vibration. If this "abnormal frequency phenomenon" is present within the working temperatures and load capacitances of the piezo-electric vibrator, this gives rise to various problems such as unsatisfactory performance and unstable operation of the piezo-electric vibrator.

SUMMARY OF THE INVENTION

According to the present invention, at least one additional mass for purpose of frequency adjustment is formed in the shape of a line on or near the nodal line of a desirable one of 3-fold harmonic vibrations.

It is an object of the present invention to improve upon the thickness-shear mode quartz oscillator or vibrator described in U.S. patent application Ser. No. 876,155 which had been invented by the same inventors as the present invention.

Another object of the present invention is to further reliably prevent the undesirable occurence of the "abnormal frequency phenomemom".

Still another object of the present invention is to provide a piezo-electric vibrator of more stable operation and higher performance.

BRIEF DESCRIPTION OF THE DRAWING

The foregoing together with further features, objects and advantages of the present invention will be more fully understood from the following description in accordance with the accompanying drawings in which.

DETAILED DESCRIPTION OF THE INVENTION

Figure 1:
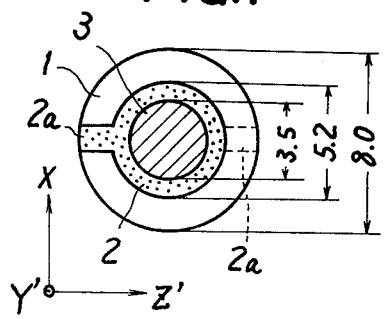
FIGS. 1 and 2 are respectively a front view and a longitudinal sectional view of a conventional AT-cut quartz vibrator.
Figure 2:
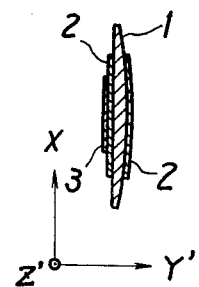

FIGS. 1 and 2 illustrate an example of a heretofore known plano-convex type AT-cut quartz vibrator (fundamental frequency $f_0 \div 4.2$ MHz), which comprises a quartz piece 1, driving electrodes 2,2 outwardly extending electrodes $2_a, 2_a$ and an addition mass 3. The quartz piece 1 has a diameter of 8.00 mm and a center thickness of 0.41 mm. The driving electrodes 2,2 are formed on the opposite surfaces of the quartz piece 1 by evaporation or other method and have a diameter of 5.20 mm. The outwardly extending electrodes $2_a$, $2_a$ extend integrally from the driving electrodes 2,2 in the radial direction and are connected to supporting springs (not shown). The addition mass 3 is formed as a film on one of the driving electrodes 2,2 by evaporation or other method in order to adjust the frequency $f_0$. The addition mass 3 has a truly circular shape and its center is coaxial with that of the driving electrodes 2,2. The addition mass 3 is generally made of the same material as that of the driving electrodes 2, 2 (e.g. Au, Ag). If desired, the addition mass 3 may be formed on each of the driving electrodes 2, 2 rather than on only one as shown. The quantity of material evaporated to form the addition mass 3 is referred to as a "plate-back quantity" and is expressed in terms of the frequency drop (KHz) caused by forming the addition mass 3.

Figure 3:
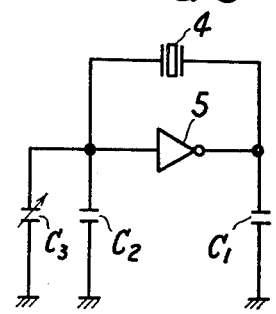
FIG. 3 is a diagram of a driving circuit incorporating the vibrator of FIGS. 1 and 2.
Figure 4:
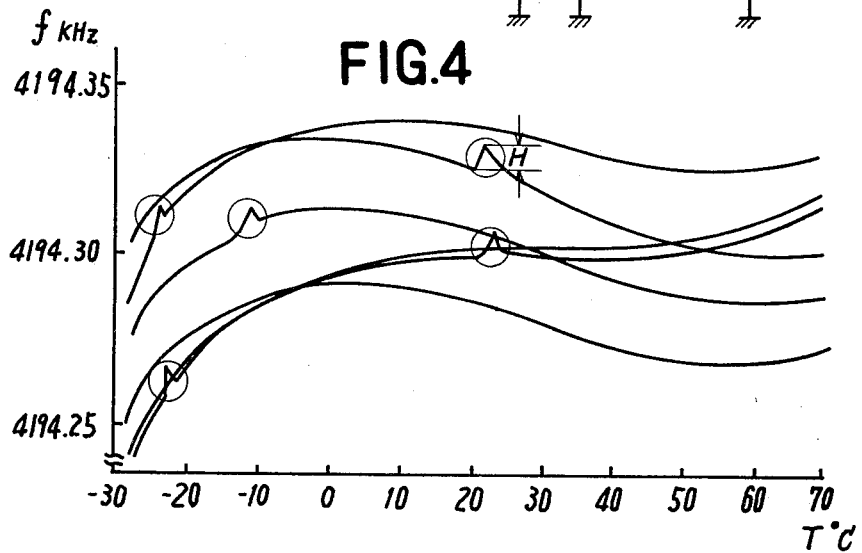
FIG. 4 is a frequency-temperature characteristic diagram of the conventional AT-cut quartz vibrator.

A number of quartz vibrators as described above are driven, as shown in FIG. 3, by using a driving circuit comprising load capacitances $C_1$, $C_2$ and $C_3$ and a C-MOS type integrated circuit 5 not having a frequency selection circuit in its oscillation loop to measure its frequency-temperature characteristics. In FIG. 3, the reference number 4 indicates the above-described quartz vibrator. The results of such measurement are shown in FIG. 4 which is a graph whose ordinate represents the frequency f (KHz) and whose abscissa represents the temperature T (°C.). Those portions of the graph which are circled represent the positions at which the above-mentioned "abnormal frequency phenomenon" occurs.

Figure 5:
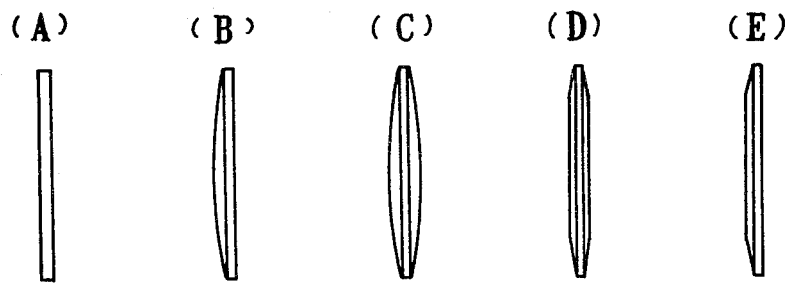
FIG. 5 shows side views of various types of vibrators.

It has been found that this "abnormal frequency phenomenon" arises from the mutual interference between a fundamental wave current fed back by the fundamental main vibration, and a harmonic wave current fed back by the harmonic vibrations, and that this "abnormal frequency phenomenon" is different from the conventional "jump phenomenon". It has also been ascertained that this "abnormal frequency phenomenon" is more likely to occur in a vibrator, of the type shown in FIGS. 1 and 2 have an addition mass 3 on a driving electrode 2 for the fine adjustment of the frequency. Moreover, this "abnormal frequency phenomenon" occurs more strikingly in convex lens type AT-cut quartz vibrators such as the plano-convex type of FIG. 5 (B), in the bi-convex type of FIGS. 5 (C), and in the bevelled types of FIGS. 5 (D) and 5 (E), than in the plate type of FIG. 5 (A). It has also been confirmed that the "abnormal frequency phenomenon" takes place even in vibrators not having the additional mass 3.

Figure 6:
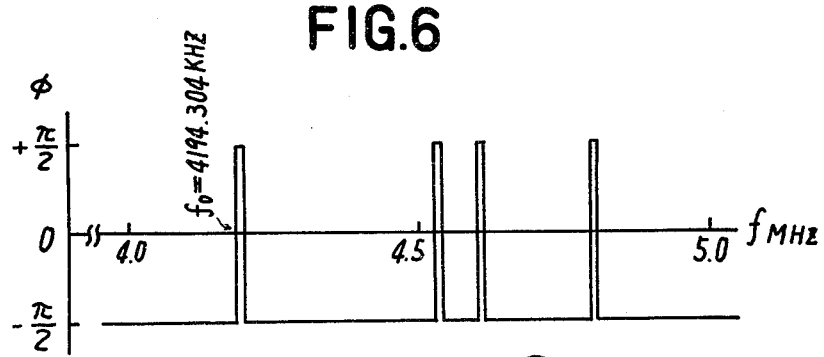
FIG. 6 is a frequency-phase characteristic diagram of the conventional AT-cut quartz vibrator.
Figure 6:
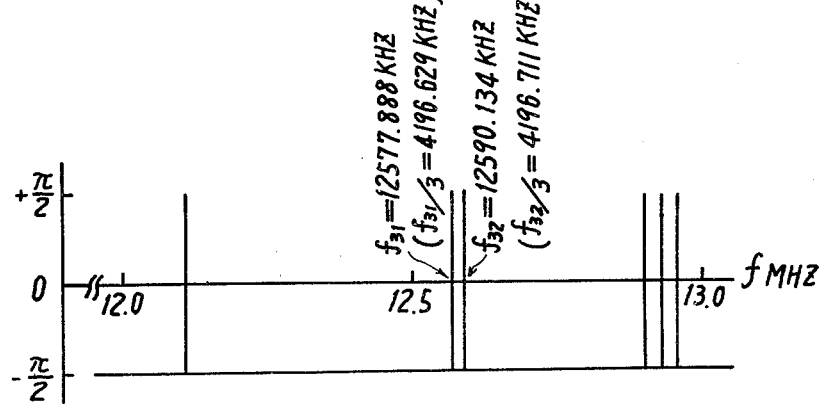
Figure 7:
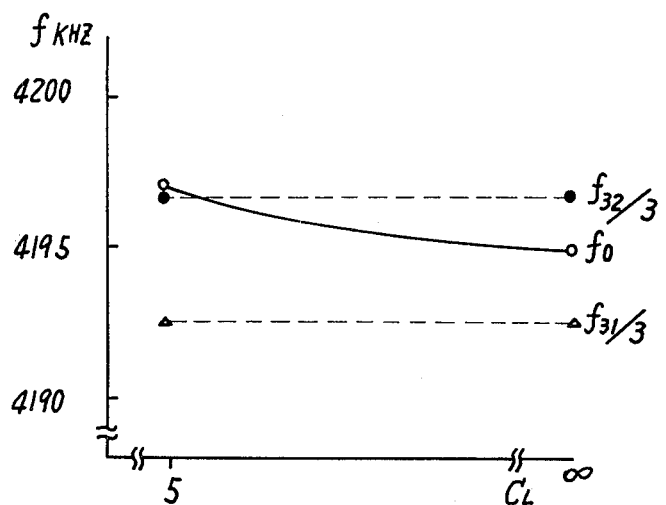
FIG. 7 is a load capacitance characteristic diagram of the conventional AT-cut quartz vibrator.

FIG. 6 illustrates the frequency-phase characteristics (resonance characteristics) of a sample of conventional plano-convex type AT-cut quartz vibrators (in which the plate-back quantity of the addition mass 3 is 4 KHz), where $f_0$ is the fundamental frequency and $f_{31}$ and $f_{32}$ are frequencies of a group of harmonic vibrations that are present near the triple frequency of the fundamental frequency $f_0$. As shown in the load capacitance characteristic curve of FIG. 7, the fundamental frequency $f_0$ varies in accordance with the load capacitance $C_L$ (The frequency adjustment of the quartz vibrator uses this phenomenon). However, $f_{31}/3$ and $f_{32}/3$ hardly cause any change. In a practical application, the load capacitance $C_L$ is mostly set at 10 PF or below because a smaller load capacitance generally provides a wider range for the frequency adjustment. Accordingly, in the working range of the load capacitance $C_L$, it sometimes occurs that the fundamental frequency $f_0$ coincides with the frequency $f_{32}/3$. Even when these frequencies do not coincide, they become coincident with each other under certain temperature conditions because the frequencies are extremely close to each other. In this instance, the frequency $f_{32}/3$ exerts an influence on the fundamental frequency $f_0$ and thus causes the "abnormal frequency phenomenon". This generally applies to a group of harmonic vibrations of a multiple of an odd number of the fundamental frequency $f_0$.

In other words, in a piezo-electric vibrator of the thickness-shear mode type such as an AT-cut quartz vibrator, there are almost always present a series of a group of harmonic vibrations in the range of n (odd number) times the frequency of the fundamental frequency $f_0$. Further, some of the harmonic vibrations may satisfy the relationship $f_0 = f_{ns}n$ between its frequency $f_{ns}$ and the fundamental frequency $f_0$ according to circumstances such as manufacturing errors of the vibrator, used conditions of the vibrator or characteristics of the driving circuit.

For the above-described reason, the "abnormal frequency phenomenon" shown in FIG. 4 is very likely to occur. The magnitude H of the "abnormal frequency phenomenon" (see FIG. 4) becomes greater as the degree n of the harmonic vibration becomes smaller.

The reason why this "abnormal frequency phenomenon" has not so far been a serious problem is that the occurrence of the phenomenon depends in particular upon the kind and performance of the driving circuit used therefor. This "abnormal frequency phenomenon" does not occur, for example, when a piezo-electric vibrator of the thickness shear mode type is driven by an oscillation circuit having a frequency selection/tuning circuit such as a tank circuit. Moreover, when a C-MOS type integrated circuit 5 not having a frequency selection circuit in its oscillation loop as shown in FIG. 3 is used, the "abnormal frequency phenomenon" does not occur, or is smaller even when it does occur, if the high frequency response characteristics of the integrated circuit 5 are not very good. As the high frequency response characteristics of the integrated circuit 5 become better, however, the "abnormal frequency phenomenon" is more noticeable and more likely to occur. Hence, the "abnormal frequency phenomenon" will become a serious problem in the future when the development of the integrated circuit proceeds further and its high frequency response characteristics are enhanced.

Although the inventors of the present invention had heretofore described in U.S. application Ser. No. 876,155 construction for very easily and reliably preventing the above-described "abnormal frequency phenomenon" in vibrators of the thickness-shear mode type, it has been found that the addition mass can have further suitable shape or position to eliminate the "abnormal frequency phenomenon" as a result of further study and analysis of this phenomenon.

An embodiment in accordance with the present invention will be described next.

Figure 8:
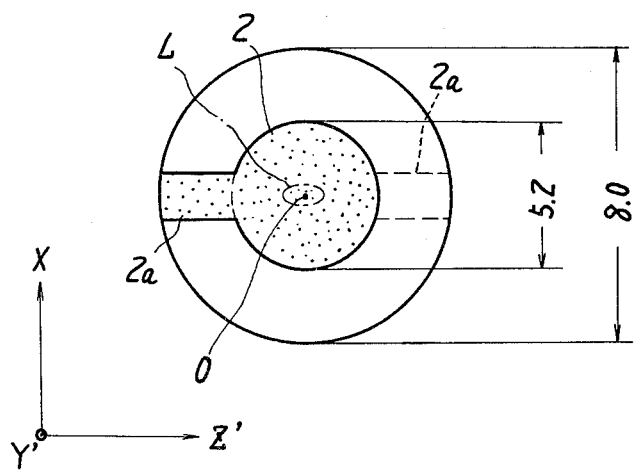
FIG. 8 is an enlarged front view of an AT-cut quartz vibrator, in the preceeding process that an additional mass is formed.
Figure 9:
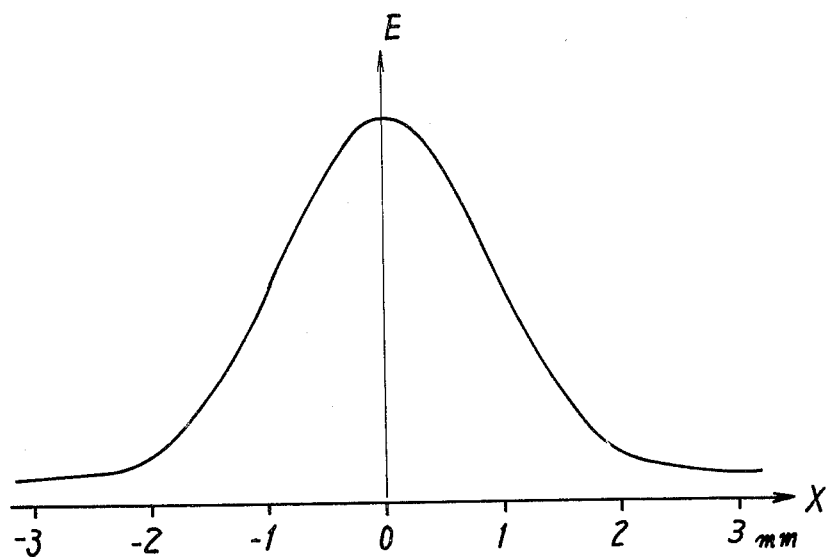
FIGS. 9 and 10 are diagrams of the distribution of the vibration energy of the fundamental main vibration of an AT-cut quartz vibrator respectively on the X axis and the Z' axis.
Figure 10:
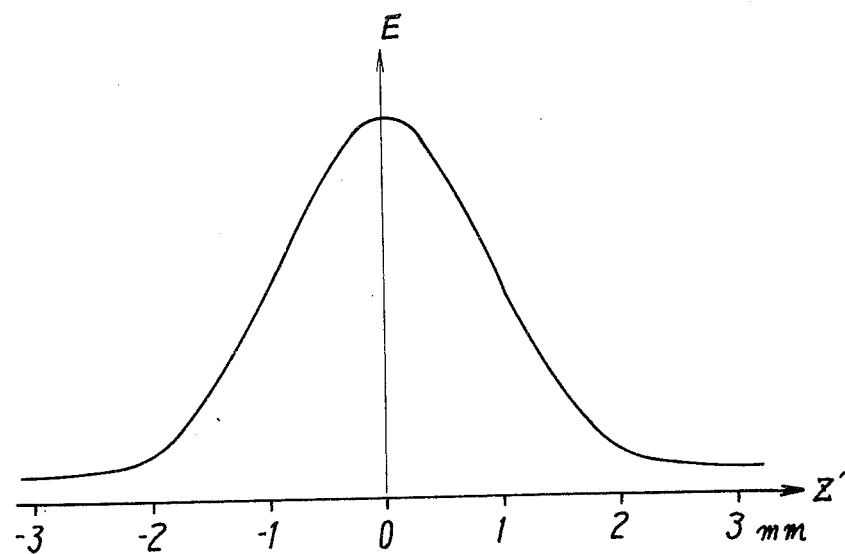
Figure 11:
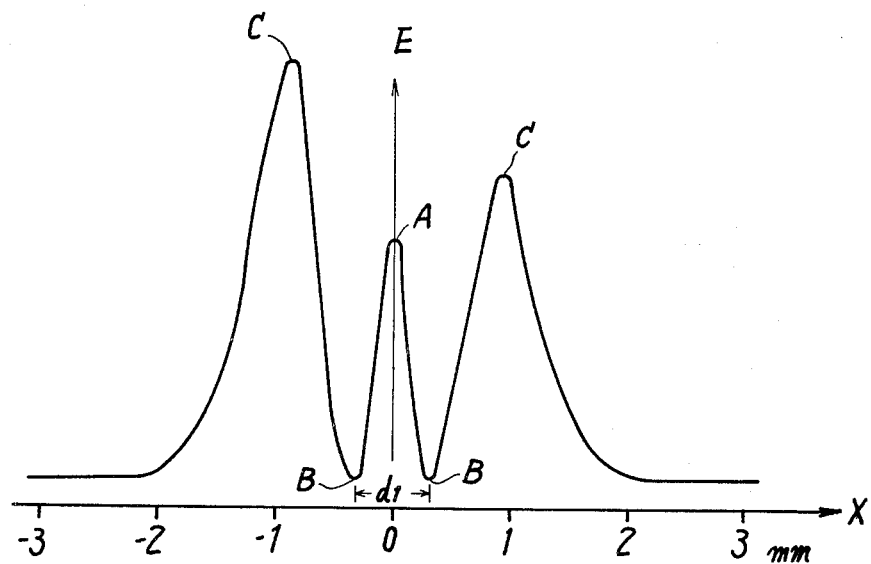
FIGS. 11 and 12 are diagrams of the distribution of the vibration energy of a 3-fold harmonic vibration of an AT-cut quartz vibrator respectively on the X axis and the Z' axis.
Figure 12:
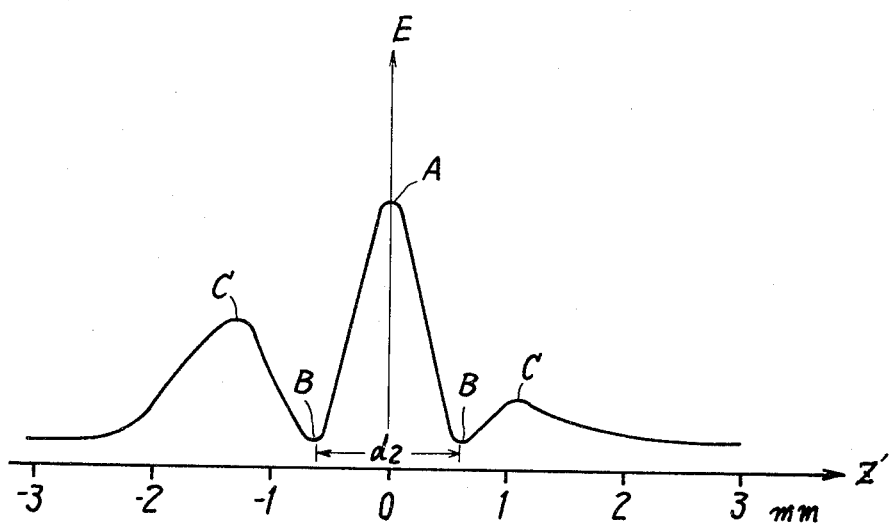
Figure 13:
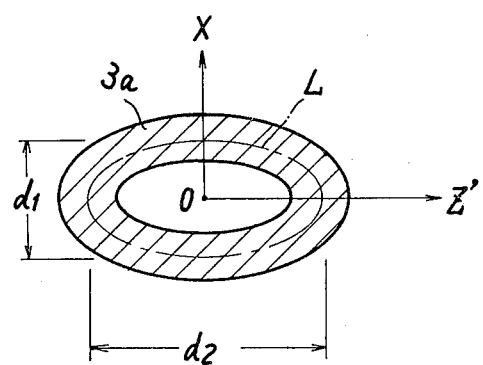
FIG. 13 is an enlarged front view of an addition mass of one embodiment of the present invention.

A plano-convex type AT-cut quartz vibrator (the quartz piece 1 and the driving electrodes 2,2 have the same shape and size as those in the conventional devices), as shown in FIG. 8, is driven by using the same circuit as that shown in FIG. 3 at the load capacitance $C_L = \infty$, and before formation of the addition mass, to measure the distribution of the vibration energy of the fundamental main vibration ($f_0 = 4203.580$ KHz) and the 3-fold harmonic vibration ($f_{32} = 12595.66$ KHz, $f_{32}/3 = 4198.55$ KHz) by the well-known probe method. The results of such measurement are shown in FIGS. 9, 10, 11 and 12 which are graphs whose ordinate represents the strength of the vibration energy E and whose abscissa represents the X axis or the Z' axis of the quartz piece 1. The fundamental main vibration has the distribution of the vibration energy, as shown in FIGS. 9 and 10, which concentrates near the center O of the quartz piece 1 and which continuously and gradually reduces towards the peripheral portion. This fact has been well known for quite some time. However, in accordance with the invention it has been discovered that the harmonic vibration has the distribution of the vibration energy, as shown in FIGS. 11 and 12, which is swollen at a peak A being present on the center O of the quartz piece 1 and at a peak C being present outside a node B, and which reduces toward the node B from both of the peaks A and C and which gradually reduces toward the peripheral portion from the peak C. That is to say, the harmonic vibration has an elliptic nodal line L, as shown in FIGS. 8 and 13, which is formed by the concurrence of the node B. The nodal line L, in the case of this vibrator having the above-described shape and size, has a distance $d_1$ of about 0.6 mm on the X axis and has a distance $d_2$ of about 1.2 mm on the Z' axis.

On the base of results of such measurements, in this embodiment, an addition mass $3_a$ is formed, as shown in FIG. 13, in the form of a doughnut or elliptic annulus having a width of about 0.2 mm on the nodal line L on the plane surface of the driving electrodes 2,2 as shown in FIG. 8 by evaporation or other method. If desired, the addition mass $3_a$ may be formed on the other curved surface or on each of the driving electrodes 2, 2. Such addition mass $3_a$ hardly has influence upon the 3-fold harmonic vibration and instead has influence effectively upon the fundamental main vibration because it is formed on the nodal line L of the former vibration and this nodal line L being present in the area where the vibration energy of the latter vibration is sufficiently great. Consequently, the frequency $f_{32}$ of the 3-fold harmonic vibration hardly varies whereas, the frequency $f_0$ of the fundamental main vibration drops effectively. Thus the difference between $f_{32}/3$ and $f_0$ becomes larger and the two hardly coincide under any working load capacitances and temperatures. As results, the "abnormal frequency phenomenon" can not be seen at all.

Moreover, although there are further high degree harmonic vibrations, the 3-fold harmonic whose degree n is the smallest have the most remarkable influence to give riise to the "abnormal frequency phenomenon". Although there is a harmonic vibration of frequency $f_{31}$ except that of frequency $f_{32}$ in a group of 3-fold harmonic vibrations, the former hardly has the possibility that the frequency $f_{31}/3$ coincides with the fundamental frequency $f_0$. Consequently, the "abnormal frequency phenomenon" can be sufficiently eliminated or prevented if the countermeasure is considered against the 3-fold harmonic vibration of the frequency $f_{32}$.

Figure 14:
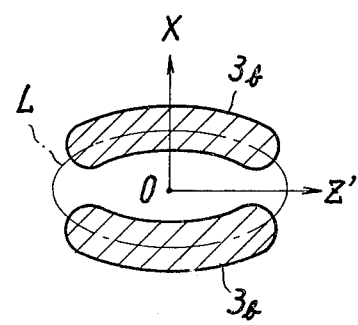
FIG. 14 is an enlarged front view of addition masses of an alternate embodiment of the present invention.

Furthermore, the addition mass $3_a$ may be formed like addition masses $3_b$, $3_b$ in another embodiment as shown in FIG. 14. Bècause a mask, which is employed to form the addition mass by evaporation or other method, is obliged to be provided with a center mask portion and a peripheral mask portion which are connected to each other at at least one position, the addition mass has a cut-off portion at corresponding positions. In such case, the cut-off portion of the addition mass is preferably positioned on the Z' axis as shown in FIG. 14 because the effect that the addition mass exerts to the fundamental main vibration becomes greater as the additional mass is located as close as possible to the center O of the quartz piece 1.

Although the foregoing embodiments of the present invention relate to AT-cut quartz vibrators, the explanation can apply also to other piezo-electric vibrators, such as BT-cut quartz vibrators or ceramic vibrators, which vibrate in the thickness-shear mode.

As described in detail in the foregoing paragraph, the addition mass $3_a$ or $3_b$ in accordance with the present invention merely has effective influence on the fundamental main vibration and hardly has influence on the 3-fold harmonic vibration. Thus the "abnormal frequency phenomenon" can be further reliably prevented within the practical range of working load capacitances and temperatures. This prevention against the "abnormal frequency phenomenon" can be effected merely by changing the shape of the aperture of the evaporation mask. Hence, the carrying out of the present invention never requires any change in the conventional production process and is therefore extremely simple. In particular, a piezo-electric vibrator in accordance with the present invention exhibits excellent effects in the case that the vibrator is driven by using a C-MOS type integrated circuit not having a frequency selection circuit in its oscillation loop and that its vibration mode is the thickness-shear mode. The benefits of the invention will become more noticeable as the high frequency response characteristics of the integrated circuit are further improved.

What we claim is:

1. A thickness-shear mode piezo-electric vibrator comprising: a piezo-electric crystal operable in the thickness-shear mode to vibrate in its fundamental mode, driving electrodes formed on opposed surfaces of said crystal, and an addition mass formed on at least one of said driving electrodes, the improvement wherein said addition mass is suitably positioned on the nodal line of a 3-fold harmonic vibration and on the area where the vibration energy of the fundamental main vibration is sufficiently large so that the frequency $f_O$ of the fundamental main vibration and the frequency $f_{3s}$ of the 3-fold harmonic vibration always satisfy the following relation within the practical application ranges of temperature and load capacitance;

$$f_O \neq \frac{f_{3s}}{3}.$$

2. A thickness-shear mode piezo-electric vibrator according to claim 1; wherein said addition mass overlies the entire nodal line of the 3-fold harmonic vibration.

3. A thickness-shear mode piezo-electric vibrator according to claim 1; wherein said addition mass overlies a major portion of the nodal line of the 3-fold harmonic vibration.

4. A thickness-shear mode piezo-electric vibrator according to claim 1; wherein said addition mass consists of a single mass.

5. A thickness-shear mode piezo-electric vibrator according to claim 1; wherein said addition mass comprises two separate masses each each positioned on a portion of the nodal line of the 3-fold harmonic vibration.

6. A thickness-shear mode piezo-electric vibrator according to claim 1; wherein said addition mass has the general shape of an elliptic annulus.

7. A thickness-shear mode piezo-electric vibrator according to claim 1; wherein said addition mass has the general shape of an elliptic annulus with at least one of its two ends cut off.

8. A thickness-shear mode piezo-electric vibrator according to claim 1; wherein said piezo-electric crystal is selected from the group consisting of plano-convex type, biconvex type and bevelled type.

* * * * *